(12) United States Patent
Rearick

(10) Patent No.: US 6,715,105 B1
(45) Date of Patent: Mar. 30, 2004

(54) METHOD FOR REDUCING STORED PATTERNS FOR IC TEST BY EMBEDDING BUILT-IN-SELF-TEST CIRCUITRY FOR CHIP LOGIC INTO A SCAN TEST ACCESS PORT

(75) Inventor: Jeff Rearick, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 577 days.

(21) Appl. No.: 09/713,517

(22) Filed: Nov. 14, 2000

(51) Int. Cl.[7] ............................................. G01R 31/28
(52) U.S. Cl. ............................ 714/30; 25/732; 25/733; 25/734
(58) Field of Search ........................... 714/25, 30, 732, 714/733, 734, 735

(56) References Cited

U.S. PATENT DOCUMENTS

| | | | | |
|---|---|---|---|---|
| 5,570,375 A | * | 10/1996 | Tsai et al. ................... | 714/727 |
| 5,983,380 A | * | 11/1999 | Motika et al. ............... | 714/733 |
| 5,991,898 A | * | 11/1999 | Rajski et al. ................ | 714/30 |
| 6,189,115 B1 | * | 2/2001 | Whetsel ....................... | 714/28 |
| 6,240,537 B1 | * | 5/2001 | Sim ............................. | 714/732 |
| 6,327,687 B1 | * | 12/2001 | Rajski et al. ............... | 714/738 |
| 6,442,720 B1 | * | 8/2002 | Koprowski et al. ......... | 714/726 |
| 6,516,432 B1 | * | 2/2003 | Motika et al. ............... | 714/732 |
| 6,654,920 B1 | * | 11/2003 | Hetherington et al. ...... | 714/733 |
| 6,658,617 B1 | * | 12/2003 | Wong ........................... | 714/733 |
| 6,665,828 B1 | * | 12/2003 | Arimilli et al. ............. | 714/726 |
| 6,668,347 B1 | * | 12/2003 | Babella et al. .............. | 714/733 |
| 6,668,348 B1 | * | 12/2003 | Nakamura ................... | 714/733 |

OTHER PUBLICATIONS

G. Hetherton, T. Fryars, N. Tamarapalli, M. Kassab, A. Hassan, and J. Rajski, "Logic BIST for Large Industrial Designs: Real Issues and Case Studies", 1999 ITC International Test Conference, Paper 142, ISBN 0–7803–5753–1/ 99 IEEE.

* cited by examiner

*Primary Examiner*—Scott Baderman
*Assistant Examiner*—Anne L. Damiano

(57) ABSTRACT

A test method and apparatus allows simultaneous loading of multiple scan chains via a single common scan-in port (SDI) and a scan clock signal SCAN CLOCK. Data is scanned into one or more scanpaths from a scan data in (SDI) port under the control of a clock signal, either directly or indirectly through a linear feedback shift register (LFSR). Scan-out data output from the scanpaths may be read at the scan data out (SDO) port, either directly or indirectly through a signature register with optional masking functionality.

17 Claims, 5 Drawing Sheets

METHOD FOR REDUCING STORED PATTERNS FOR IC TEST BY EMBEDDING BUILT-IN-SELF-TEST CIRCUITRY FOR CHIP LOGIC INTO A SCAN TEST ACCESS PORT

FIELD OF THE INVENTION

The present invention pertains generally to testing of digital electronic systems, and more particularly to a method for reducing stored patterns for integrated circuit test by embedding built-in-self-test circuitry for chip logic into a scan test access port.

BACKGROUND OF THE INVENTION

As the complexity of integrated circuits (ICs) increases, so does the cost of testing the circuits during process and manufacture. As a result, integrated circuit chips are increasingly designed using a process commonly referred to as Design For Testability (DFT). Under the DFT model, integrated circuits are designed to include on-chip testing hardware to allow manufacturing testers to apply external tests to the chip and/or to allow internal tests to execute within the chip to verify the proper functionality of the chip. The goal is to balance the amount of the on-chip testing hardware with the costs of external test equipment and the amount of time and cost required to generate effective tests and detect or isolate faults such that the overall costs due to the additional on-chip testing hardware is reduced.

One well-known DFT technique is called scan testing. Scan testing requires the use of a set of scan registers, each of which possesses both serial- and parallel-load capability. In a typical scan test, a set of scan registers is connected in series. Such a set of serially connected scan registers is referred to herein as a scan path. Input data is loaded serially ("shifted") into each of the scan registers via a Test Access Port (TAP). Once the input data is loaded, the contents of the scan registers are driven into the circuit under test (CUT) in parallel and the CUT is instructed to execute one or more clock cycles. The output of the CUT after execution of the one or more clock cycles is then captured in parallel into the scan registers and shifted serially out under control of the TAP.

One form of scan testing is known as boundary scan. In boundary scan, each of the scan registers is coupled between an I/O pin of the CUT and circuitry internal to the CUT. During a boundary scan test, the scan registers therefore replace the I/O pins of the IC for loading and receiving data.

Scan testing is advantageous for several reasons. First, scan test allows a high degree of controllability and observability of signals inside the chip. Any set of data inputs can be shifted into a given scan path and applied to the CUT, and the CUT may be allowed to execute for any controlled number of clock cycles before the output is observed. Scan paths may be fully integrated (meaning that a scan register is substituted for each functional register in a given data path) or isolated (meaning that the scan register is not in the normal data path). This gives the designer of the IC flexibility in determining which portions of the CUT warrant special on-chip testing hardware. In addition, because the scan registers are loaded via a serial TAP, test data can be input to the CUT via a single serial data line rather than by applying a tester channel (e.g., a bed-of-nails tester) to each I/O pin or test node of the CUT. This significantly reduces tester configuration and setup costs and ensures that no pin-to-pin data interference occurs.

As just described, scan testing requires the use of a TAP and a serial communications protocol for controlling the shifting in of test stimulus, test execution, and shifting out of test response data. The TAP architecture and TAP communications protocol has been standardized in the well-known IEEE 1149.1 Standard Test Access Port and Boundary Scan Architecture [IEEE 1989].

FIG. 1 is a block diagram of the chip architecture for the IEEE 1149.1 standard. As shown, a chip (or board) 10 implemented according to the standard includes coupled via a plurality of scan cells 50a, 50b, . . . 50p coupled between chip specific application logic 74a–74d (interconnections not shown) and a plurality of input and/or output (I/O) pads 52a, 52b, . . . , 52p. Chip 10 includes a TAP circuit block 20 having a test data in (TDI) port 22, a test mode select (TMS) port 24, a test clock (TCK) port 26, and a test data out (TDO) port 28. TAP circuit block 20 includes an instruction register 32, a bypass register 34, and optionally one or more miscellaneous registers 36, each coupled between the TDI input and the input of a multiplexer 38. Boundary scan cells 50a, 50b, . . . 50p are connected in series between the test data in TDI input and an input of multiplexer 38. TAP circuit block 20 also includes a scan-in port $S_i$ 80 and one or more scan-out port $S_o$ 82, discussed hereinafter. Scan-in port 80 is coupled to the TDI port 22; scan-out port(s) 82 are coupled to an input of multiplexer 38. Multiplexer 38 is programmable to select one of its inputs, including the instruction register 32, the bypass register 34, one of the miscellaneous registers 36, (one of) the scan-out port(s) 82, or the output of the boundary scan chain 50 (i.e., the contents of scan cell 50p), for output onto the TDO port 28. TMS port 24 and TCK port 26 are coupled to a TAP controller 30 (which implements a finite state machine FSM 31). The current state of the TMS signal, in combination with its past states, determines the operation of the TAP 20. Test clock signal TCK is used to synchronize input of the mode select signal TMS and test data in signal TDI into the TAP. Test mode select signal TMS controls the finite state machine implemented in the TAP controller 30 which controls whether the TAP 20 accepts test data or instructions.

Scan testing is not limited to boundary scan (implemented in FIG. 1 by scan path 50), where the scan path includes scan cells only at the I/O pins. Scan paths may be implemented anywhere on the chip where a set of data storage cells exist. Since integrated circuits are often implemented modularly (i.e., where the integrated circuit functions are divided into a set of separate logic blocks) multiple internal scan paths may be implemented around each logic block to test each logic block independently of the other logic blocks. FIG. 1 illustrates the implementation of multiple internal scan paths 72a, 72b, 72c, and 72d. Each scan path implements a set of interconnected scan cells (not shown) corresponding to a set of data storage cells in a respective logic block 74a–74d. Since each logic block is independent of the others, the number of scan cells in each scan path 72a, 72b, 72c, 72d may vary. Also, since each scan path 72a, 72b, 72c, 72d is independent of the others, a single scan-in input $S_i$ 80 may be fed into each scan path without affecting the randomness of the test pattern suite applied to any given scan path. During a scan test, the TAP shifts data in from the TDI port 22 along the scan-in $S_i$ 80 path and into each scanpath[0 . . . n] 72a, 72b, 72c, 72d. The number of bits shifted into the scan paths 72a–72b via the scan-in port $S_i$ 80 is equivalent to the number of scan cells in the longest scan path 72a, 72b, 72c, or 72d. Alternatively, each scan path can be loaded one at a time with exactly the number of bits in that scan chain.

In operation, an instruction is clocked in serially from the TDI port 22 into instruction register 32. Test controller 30 responds to the instruction by configuring the test circuitry according to the instruction (e.g., selecting the input of the scan cells to come from their serial inputs via the scan chain rather than their parallel inputs via the I/O pads, or selecting the multiplexer 38 input). Each instruction enables a single serial test data register path between TDI and TDO. The instruction is then executed under the control of the TAP controller 30 (e.g., shifting data serially into or out of the scan cells in synchronization with the test clock TCK signal).

Another well-known manufacturing testing technique is called Built-In-Self-Test (BIST). The BIST technique also employs dedicated on-chip test circuitry, shown in FIG. 1 at 60, to enable an integrated circuit chip to perform self-testing, usually with only minimal assistance (such as the provision of power 7, clock 8, and reset 9 signals) from an external tester 5 or a board or a system.

BIST can include many forms of testing, each executing with minimal external assistance (e.g., using only externally provided power and clocking signals). One form of BIST is known as concurrent online testing that occurs simultaneously with normal functional operation, such as duplication and comparison. Another BIST form is known as non-concurrent online testing that occurs when the system is in an idle state, such as execution of diagnostic routines. Yet another form of BIST is known as offline testing. Off-line BIST, which is the context of the invention, occurs when the system is placed in a special test mode.

BIST circuitry has often been employed with certain special classes of circuits, most notably around regular memory array structures like Random Access Memory (RAM). BIST applied to memory structures is often referred to as MBIST. The extension of BIST techniques to general chip logic structures (i.e., logic gates) has been applied, especially in the area of scan testing, and is herein referred to as logic BIST, or LBIST. Off-line LBIST is applied to blocks of combinational logic interconnected by storage cells. BIST circuitry includes test pattern generators 62, output response analyzers 64, a distribution system including busses, multiplexers, and scan paths 72a, 72b, 72c, 72d for transmitting data from the test pattern generators 62 to the logic blocks under test (LBUTs) 74a, 74b, 74c, 74d and from the LBUTs to the output response analyzers 64, and a BIST controller 6 which controls the BIST circuitry and circuit under test during self-test. The BIST controller 6 can be implemented in the integrated circuit tester 5 off chip or can be implemented adjacent to the logic block designated for LBIST. The BIST controller controls the stepping of the LBUTs 74a–74d through a test program, controls the BIST test clocks 8, controls the configuration of the data paths throughout the CUT, and controls the shifting of data in and out of the various scan paths 72a–72d.

Effective BIST depends on the generation of effective test patterns. Test pattern generation is the topic of extensive research. Effective known testing includes exhaustive testing, pseudo-random testing, and pseudoexhaustive testing. Exhaustive tests apply every possible input to the circuit under test. For example, in an n-input m-output combinatorial circuit, this requires the application (and storage in the IC tester) of $2^n$ inputs. For a circuit with a large number of inputs, the storage requirements render this technique impractical. Furthermore, exhaustive testing does not detect faults that occur due to the sequential behavior of the circuit.

In pseudoexhaustive testing, a circuit under test is segmented into a set of sub-circuits, each of which receives a smaller subset m of the total set n of inputs (i.e., m<n). This reduces the number of test patterns from $2^n$ to $2^m$ for a given subcircuit.

Pseudorandom testing involves the application of a reduced set of test patterns, seemingly random, that are actually algorithmically generated from a starting seed; accordingly, the test pattern is deterministic, which allows the test pattern to be identically regenerated from a known seed. Pseudorandom testing is popular due to the reduction in test patterns required to be stored in the IC tester while still providing high fault coverage; in addition, with proper clock control, pseudorandom testing can be used to effectively identify faults that occur due to sequential behavior of the circuit.

Each of the test pattern generation techniques described above makes extensive use of linear feedback shift registers (LFSRs). In addition, with scan techniques, extensive use of signature registers (i.e., output compression) is made in order to simplify the verification of the serial output from the scan paths. A more detailed discussion of test pattern generation, scan, and BIST techniques may be found in Abramovici et al., "Digital Systems Testing and Testable Design", IEEE Press (1990), ISBN 0-7803-1062-4, pp. 343–489, which is incorporated herein by reference for all that it teaches.

BIST applied to combinational logic structures in an integrated circuit is problematic due to the large percentage of BIST circuit overhead as compared with the percentage of the actual circuit under test (CUT) being tested. A common compromise is to use BIST only around dense memory arrays and to use another test scheme (usually full scan) for the remainder of the chip logic.

As integrated circuits grow in size and complexity, the size of the scan test pattern set grows proportionally. The entire set of patterns, both stimulus and response, must be stored in a digital IC tester. A substantial majority of these test patterns consists of randomly selected binary values used as "filler", so named because they are required to "fill" the entire scan path, around a relatively small number of explicitly specified bits. These random fill bits are actually quite useful in detecting many defects and therefore cannot be dispensed with; however, random fill bits are not of sufficient complexity to warrant storage in the limited tester memory if another method of deriving them could be found. Accordingly, a need exists for a technique for reducing the IC tester costs in terms of both hardware and complexity. A need also exists for a technique for reducing the test circuit overhead in integrated circuits without reducing the DFT and BIST functionality on the chip.

SUMMARY OF THE INVENTION

The present invention is a novel method and apparatus for reducing IC tester complexity and hardware while simultaneously reducing the test circuit overhead in integrated circuits without compromising the DFT and BIST functionality. In accordance with the invention, an integrated circuit includes a test access port (TAP) and DFT scan circuitry. The TAP includes all the functionality required for a BIST environment within the TAP block itself, including a linear feedback shift register (LFSR), a multiple input signature register (MISR), a step counter, a shift counter, a step/shift controller, and a MISR mask register. With the addition of these elements, the need for a separate BIST module within the integrated circuit is essentially eliminated because BIST test patterns can be automatically generated using the tap circuitry and simultaneously loaded into multiple parallel scanpaths throughout the digital circuit. Because the BIST essentially utilizes existing test hardware already available on the chip, namely the TAP and the scan paths, there is no need for a separate BIST controller for controlling the generation and execution of the BIST routines. Furthermore, the tester hardware used for storing and downloading random fill test patterns in the IC tester is eliminated.

In accordance with the invention, the TAP module includes a shift register coupled in parallel with the scan-in input $S_i$ between the scan-data-in (SDI) port and the scan-in input $S_i$. At the scan-out output $S_o$, a multiple input signature register (MISR), which is preferably maskable, is coupled between the scan-out output $S_o$ and the scan-data-out (SDO) port. When it is desired to execute BIST, a test mode select TMS signal instructs the TAP controller to receive an instruction, which instructs the TAP to select the LSFR path for incoming data and to select the MISR path for outgoing data. This allows the tester to instruct the TAP to generate patterns using the LFSR, while simultaneously compressing the outgoing data from $S_o$. A shift counter may be included to allow the tester to specify the number of bits to shift in from the LFSR to the scan paths SCANPATH[0:n]. The tester simply loads a number between 1 and the length of the longest scan chain into the shift counter, and the TAP controller shifts one bit per clock cycle as the shift counter decrements once per clock cycle, repeating this process until the counter counts down to zero. A step counter allows the tester to specify the number of clock cycles to execute once the data is shifted into all the scan chains. Alternatively, or in addition, to the shift and step counters, a step/shift controller may be used to program a sequence of steps and shifts.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and apparatus for reducing IC tester complexity and hardware while simultaneously reducing the test circuit overhead in integrated circuits without compromising the Design For Test and BIST functionality is described in detail hereinafter. While the preferred embodiment is described in the context of the well-known IEEE 1149.1 standard, it is to be understood that the novel principles of the invention extend to any circuit or board implementing DFT scan techniques.

Figure 1:
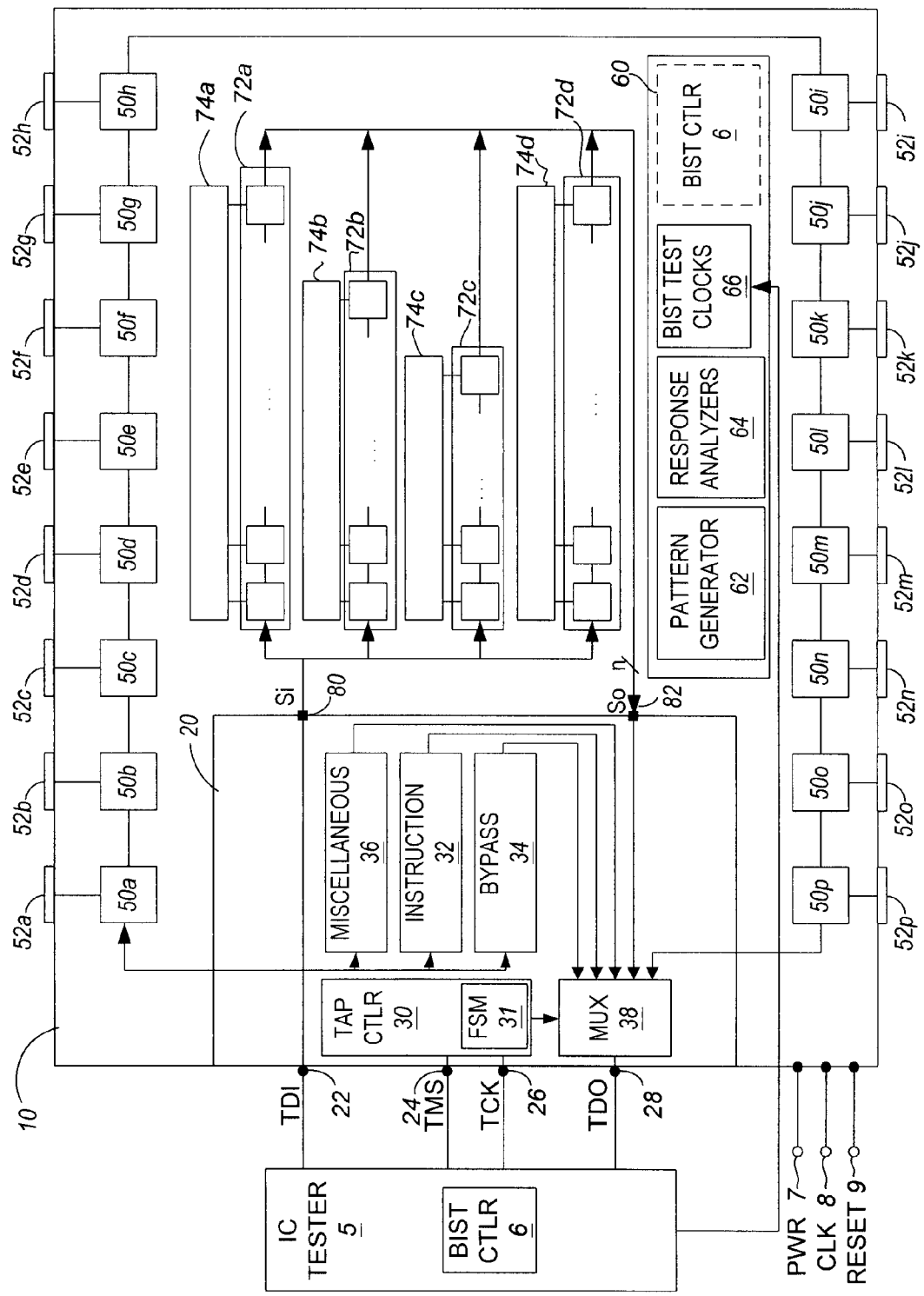
FIG. 1 is a block diagram of the chip architecture for the IEEE 1149.1 standard and DFT scan test circuitry.
Figure 2:
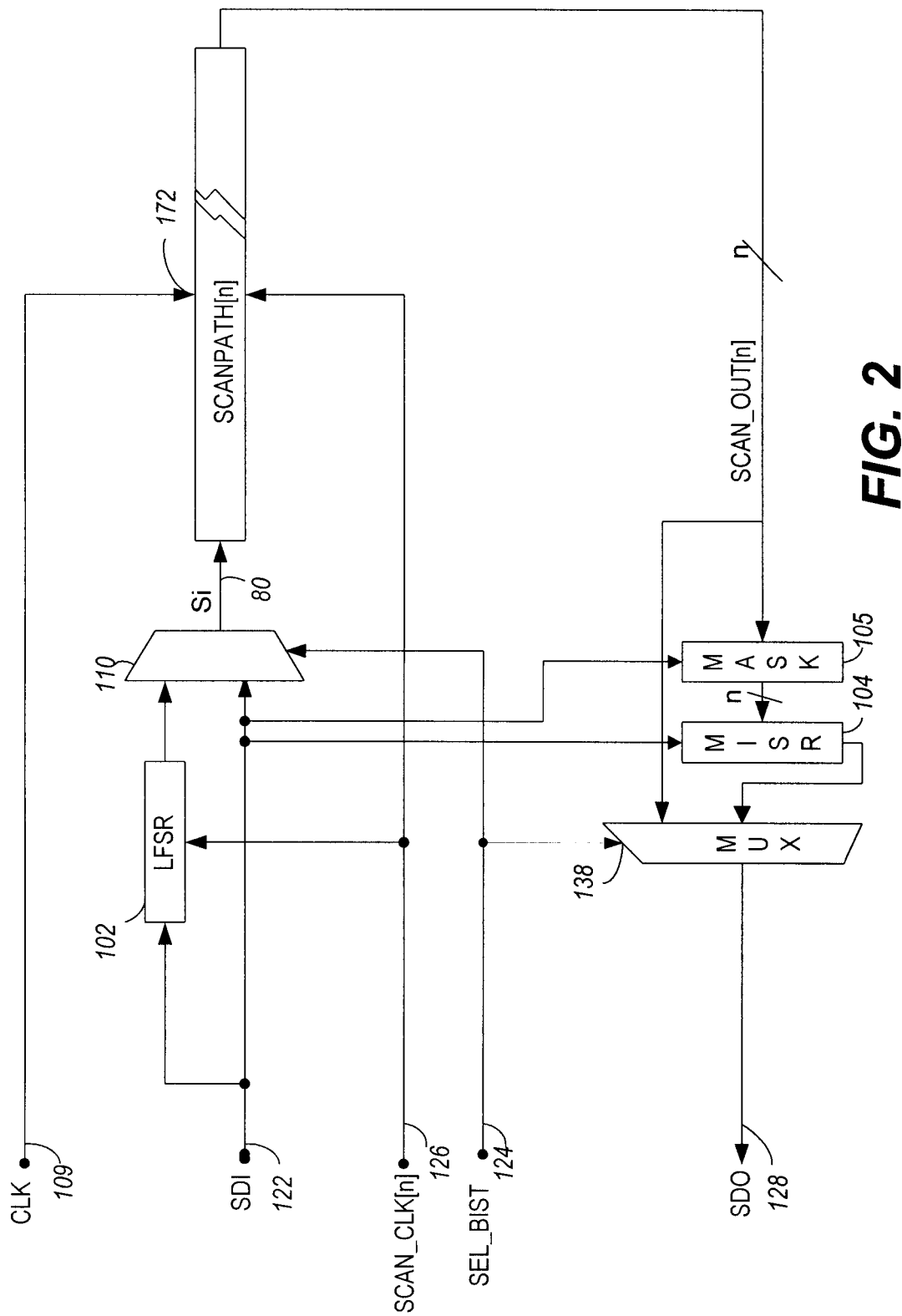
FIG. 2 is block diagram illustrating the apparatus of the invention.

FIG. 2 is block diagram illustrating the apparatus of the invention. As illustrated, data is scanned into one or more scanpaths 172 from a scan data in (SDI) port 122 under the control of a scan clock signal SCAN_CLK 126, either directly (through one port of a multiplexer 110) or indirectly through a linear feedback shift register (LFSR) 102 (through the other port of the selectable multiplexer 110). A control signal SEL_BIST 124 selects whether the scanpath(s) 172 are loaded directly from the SDI port 122 or from the output of the LFSR 102. Scan-out data SCAN_OUT is output from the scanpath(s), under the control of the scan clock signal SCAN_CLK 126. The system execution clock CLK 109 is used to capture normal system data into the registers comprising the scan path. The scan-out data SCAN_OUT may be read directly at the scan data out (SDO) port 128, either directly (through one port of a multiplexer 138) or indirectly through a signature register 104 which compresses the scan-out data SCAN_OUT to generate a signature (through another port of the selectable multiplexer 138). Preferably, the input to the signature register 104 may be masked via a signature mask register 105 to allow various bits of the scan-out data SCAN_OUT to be ignored. The masking feature is useful for masking out unknown output data generated by uninitialized internal states, for example, present at the beginning of a test.

The apparatus of the invention allows multiple scan chains to be loaded simultaneously via a single common scan-in port (SDI) and a scan clock signal SCAN_CLK, yet generates individual signatures on the output of each of the multiple scan paths, which may be individually selected for output onto a scan-out port (SDO). The LFSR may be used to automatically generate serial patterns to be loaded into the scanpaths during use for BIST.

Figure 3:
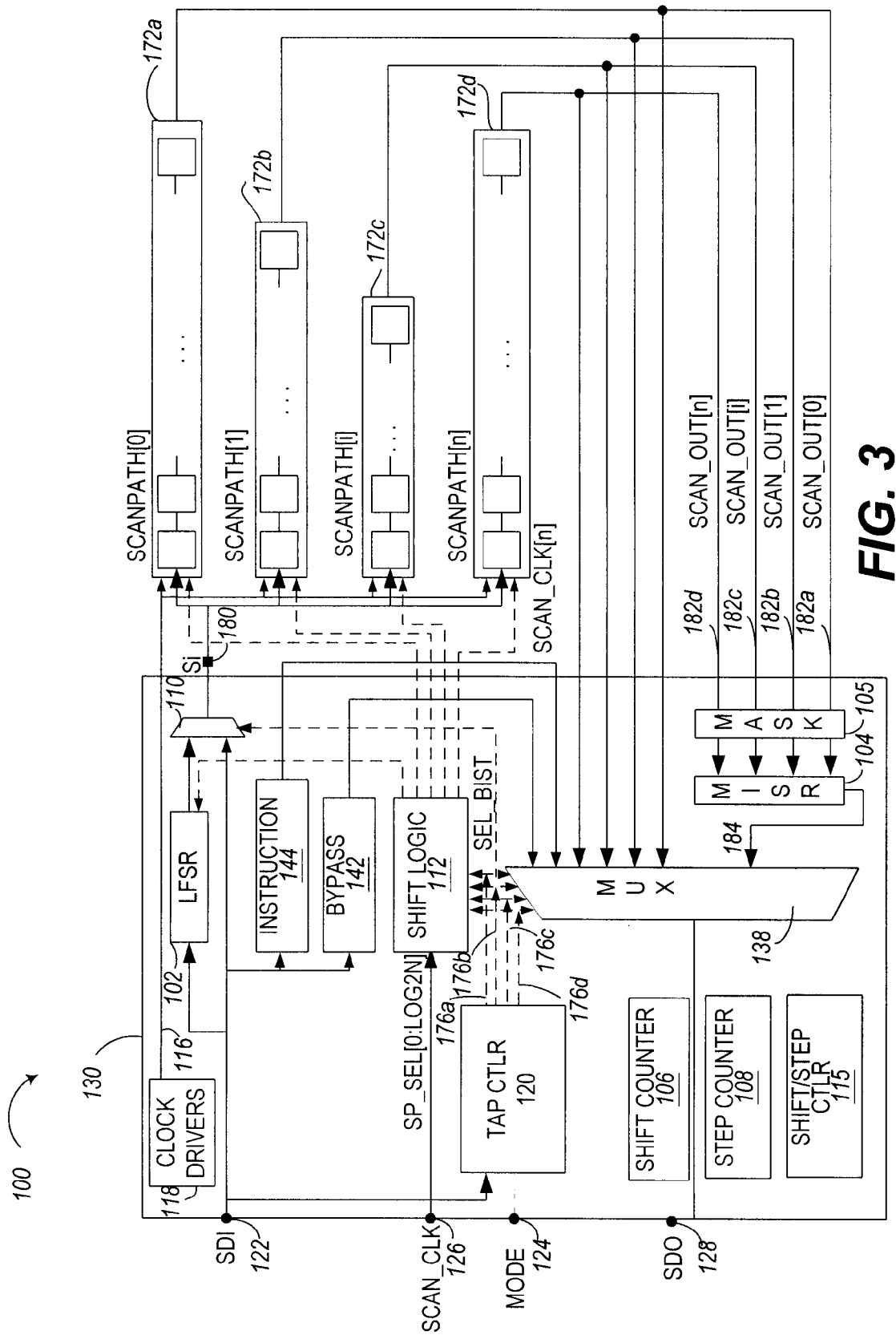
FIG. 3 is block diagram illustrating a portion of an integrated circuit 100 implementing the apparatus of the invention.

FIG. 3 is block diagram illustrating a portion of an integrated circuit 100 implementing the apparatus of the invention. As illustrated, integrated circuit 100 includes multiple scanpaths 172a, 172b, 172c, 172d, each operating to shift in data serially from a common scan-in input $S_i$ 180 and shift data out to a corresponding one of a plurality of scan-out outputs $S_o$[0 . . . n] 182a, 182b, 182c, 182d under the control of independent scan clocks SCAN_CLK[0 . . . n] 176a, 176b, 176c, 176d. Each scan path 172a, 172b, 172c, 172d comprises a plurality of serially interconnected scan cells (not shown) which may vary in length (i.e. number of scan cells).

IC 100 also includes a test access port (TAP) 120 implemented to provide full scan functionality requirements. In the preferred embodiment, TAP 120 provides a scan data-in port (SDI) 122, a clock port CK 126, a select signal port SEL_BIST 124, and a scan data-out (SDO) port 128. TAP 120 also provides scan-in $S_i$ and scan-out ports $S_o$. In the illustrative embodiment, the scan paths are implemented to share a single common scan-in signal $S_i$ 180. Each of the scan paths outputs a separate scan-out signal $S_o$[0 . . . n] 182a, 182b, 182c, 182d.

TAP 120 includes a TAP controller 130 which is implemented to provide all of the functionality of the 1149.1 standard as described in the background section. TAP controller 130 also controls the selection of a shift clock 176a, 176b, 176c, 176d by sending a select signal SP_SEL[0 . . . log2n] 178a, 178b to the shift clock logic 112. Shift clock logic 112 enables zero or more of the shift clocks 176a, 176b, 176c, 176d, which each respectively synchronizes the shifting of bits into respective scan paths 172a, 172b, 172c, 172d.

As known by those skilled in the art and as described above, the generation of BIST test patterns is typically accomplished using a linear feedback shift register (LFSR). TAP 130 implemented in accordance with the invention includes a LFSR 102 which, upon instruction to the TAP controller 130, may be connected between the SDI input port 122 and the scan-in $S_i$ port 180. In the preferred embodiment, the input of LFSR 102 is coupled to the SDI input port 122, and the output of LFSR 102 and the SDI port are connected as inputs to a multiplexer 110, which is selectable via a select signal SEL_BIST 175, which is generated by the TAP controller 130, to select one of either the SDI signal or the output of the LFSR 102 as the scan-in signal $S_i$ on scan-in port 180.

The TAP 130 of the invention also includes a signature analyzer 104 which receives the scan-out signals 182*a*, 182*b*, 182*c*, 182*d* from the respective scan paths 172*a*, 172*b*, 172*c*, 172*d*, compresses these output signals, and generates a signature 184. Preferably, the scan-out signals 182*a*, 182*b*, 182*c*, 182*d* received by the signature analyzer 104 may be masked via a signature mask register 105 to allow various bits of the scan-out data to be ignored. One of the scan-out signals 182*a*, 182*b*, 182*c*, 182*d* or signature 184 may then be selected by TAP controller 130 to be output from a multiplexer 138 on the SDO port 128. TAP controller 130 generates the multiplexer select signals SP_SEL[0:log2n] 178*a*, 178*b* which selects which one of the inputs of multiplexer 138 are output to the SDO port 128.

TAP controller 130 implements additional instructions which, when received by the TAP 120, instruct the TAP controller 130 to select either the SDI signal or the output of the LFSR 102 as the scan-in signal $S_i$ 180 and to select one of the scan-out signals 182*a*, 182*b*, 182*c*, 182*d* or signatures 184 to be output on the SDO port 128.

TAP controller 130 preferably also includes a shift counter 106 in which a shift count may be programmed. The shift count value determines the number of bits that are shifted through the LFSR 102 and/or scan paths SCANPATH[0 . . . n] 172*a*, 172*b*, 172*c*, 172*d*. In order to load all of the scan paths [0 . . . n] with pseudorandom data, the shift count value is set to the number of scan cells in the longest scan path 172*a*, 172*b*, 172*c*, or 172*d*, and each of the shift clocks 176*a*, 176*b*, 176*b*, 176*d* is enabled to cycle the number of times equal to the shift count value. In order to load selected bits of the scan paths with stored data, these specific inputs to certain data cells are input via direct input from the SDI port 122 to the scan-in port 180, while random filler bits are generated by the LFSR 102 and shifted into the scan chains where needed. This eliminates the need to store any of the random filler bits in the tester, since they can be generated in real-time via the TAP's BIST hardware.

TAP controller 130 also preferably includes a step counter 108. Step counter 108 is used by the TAP controller 130 to determine how many times to pulse the clock driver tree 118 which cycles the execution clock tree 116, causing the values from the various LBUTs to be captured in their corresponding scan paths. This function is often used in BIST to step more than one execution cycle at a time before observing the output.

Again, TAP controller 130 must implement additional instructions for loading a shift count value into the shift counter 106 and loading a step count value into the step counter 108.

The functionality of the shift counter 106 and step counter 108 may be implemented, in the alternative or in addition, using a shift/step controller 115, preferably implemented with a second LFSR. The second LFSR 115 may be used to produce a stream of 0's and 1's, each binary state 0 and 1 indicating a single shift cycle or a single step cycle. For example, if the state 0 indicates a shift and the state 1 indicates a step, an output from the second LFSR 115 of "000011" would indicate that the data should be shifted four times and then stepped twice. TAP controller 130 must implement additional instructions for loading the second LFSR 115 and processing the output of the second LFSR 115.

Figure 4:
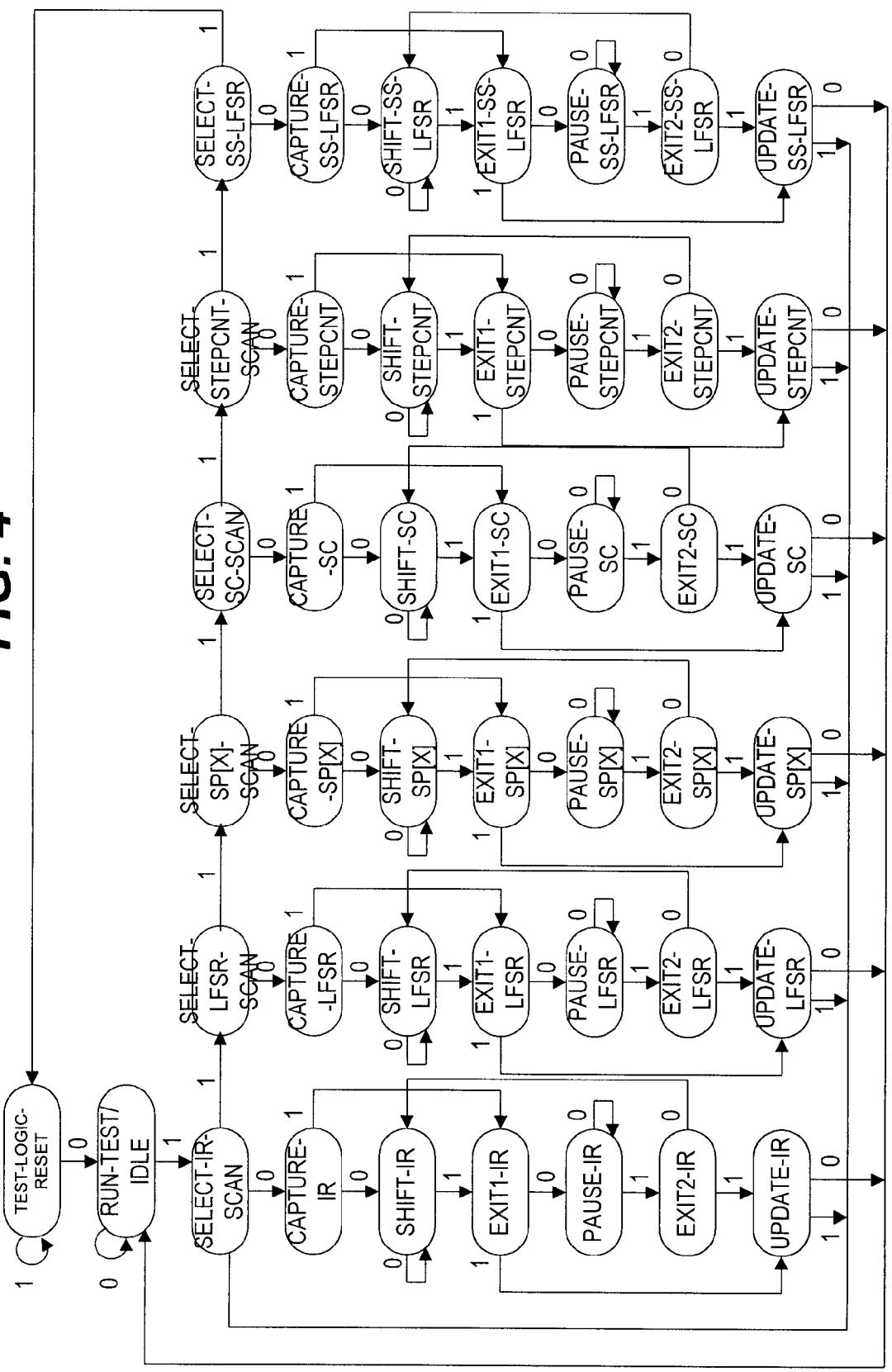
FIG. 4 is a finite state diagram of a TAP controller implemented in accordance with the invention.

FIG. 4 is a finite state diagram of a preferred embodiment of TAP controller 130 which illustrates the operation of TAP 120. The state of the TAP controller 130 is controlled by a test clock and a test mode select signal. The main state diagram consists of steady states: Test-Logic-Reset, Run-Test/Idle, Shift-IR, Pause-IR, Shift-LFSR, Pause-LFSR, Shift-SP[x], Pause-SP [x], Shift-SC, Pause-SC, Shift-StepCnt, Pause-StepCnt. Only one steady state exists for the condition when the mode select signal is set high—the Test-Logic-Reset state.

At power up, or during normal operation of the host, the TAP is forced into the Test-Logic-Reset state by driving the test mode select signal high and applying six or more test clock pulses. In this state, the TAP issues a reset signal that places all test logic in a condition that does not impeded normal operation of the host. When test access is required, the TAP exits the Test-Logic-Reset state by applying a logical 0 at the test mode select (TMS) port. This puts the TAP into the Run-Test/Idle state. From the Run-Test/idle state, an instruction register scan, a LFSR register scan, a data scanpath register scan, a shift counter register scan, or a step counter register scan can be issued to transition the TAP through the appropriate states shown in FIG. 4. The states of any of the register scan blocks are symmetrical to each other. The first action that occurs when any block is entered is a capture operation. From the capture state, the TAP transitions to either the Shift or Exit1 state. Normally, the Shift state follows the Capture state so that test data or status information can be shifted out for inspection and new data shifted in. Following the Shift state, the TAP either returns to the Run-Test/idle state via the Exit1 and Update states or enters the Pause state via Exit1. The Pause state is entered to temporarily suspend the shifting of data into the selected scan register. From the Pause state, shifting can resume by re-entering the Shift state via the Exit2 state or be terminated by entering the Run-Test/Idle state via the Exit2 and Update states.

Figure 5:
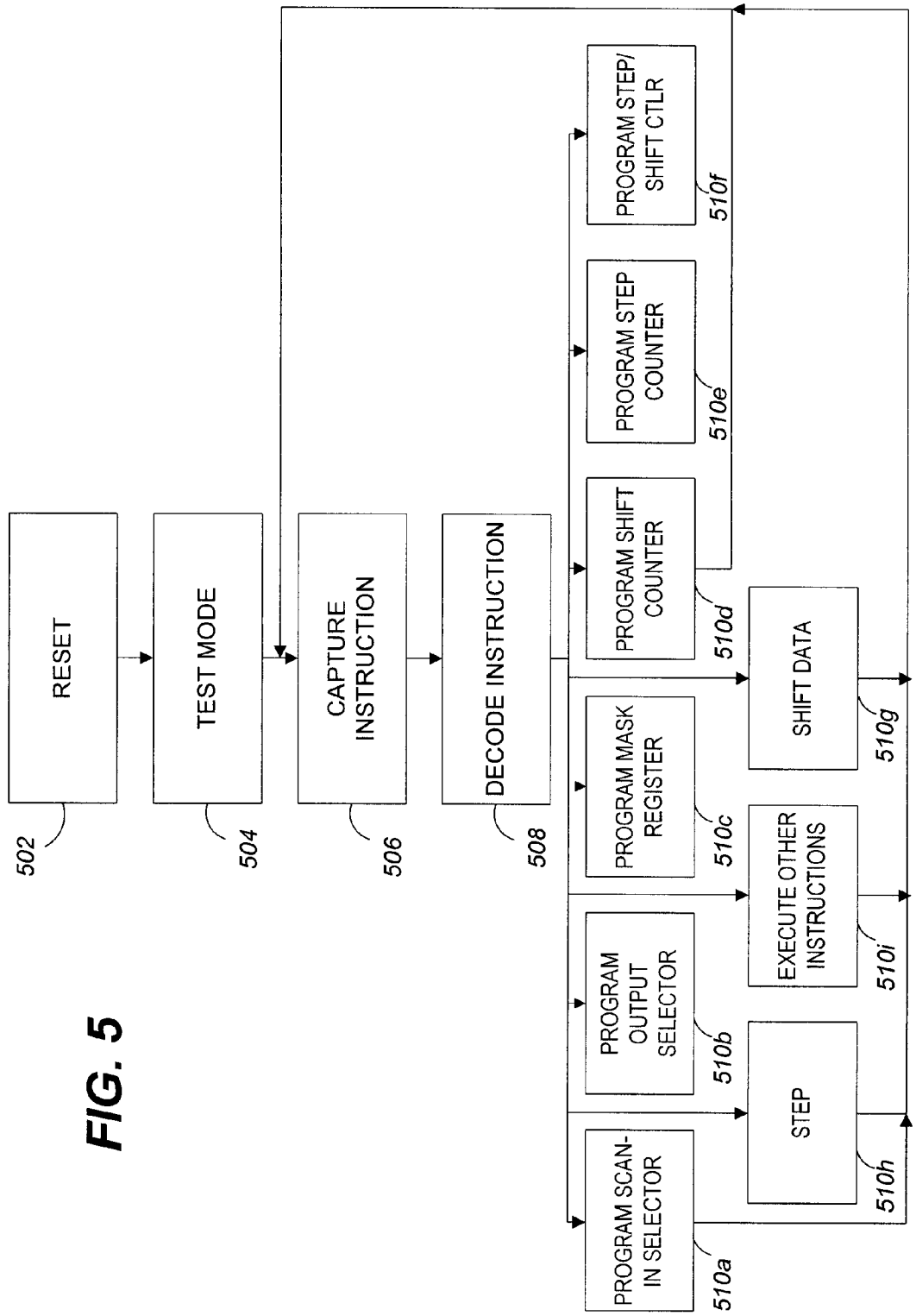
FIG. 5 is an operational flowchart illustrating the operation of the TAP controller of the invention.

FIG. 5 is an operational flowchart illustrating the operation of the TAP controller 130 of the invention. In operation, TAP controller 130 is powered up in a reset state 502 and may be returned to the reset state 502 upon indication by a sequential pattern of the mode select signal. On each test clock pulse, the next state of the TAP controller 130 is determined based on the current state of and the state of the test mode select signal. The general sequence of events is as follows: At some time after the TAP controller 130 is reset 502, it is placed into test mode 504. Once it is in test mode 504, TAP controller 130 captures an instruction 506 by shifting in data from the scan data in SDI port 122 into the instruction register 144. Once the instruction is captured, TAP controller 130 decodes 508 and then executes 510*a* . . . 510*h* the captured instruction.

The instruction is generally one of two types—either a non-data command (e.g., a configuration or execution command) or a data manipulation command. Non-data commands include instructions that tell the TAP controller 130 how to set up the scan and/or data paths between the SDI port 122 and SDO port 128, or which instruct the controller 130 how to step 510*h* the CUT one or more clock cycles of execution. Data commands require the shifting in 510*g* of data into the scan path or register configured between the SDI port 122 and SDO port 128. Data instructions include shifting 510*g* data in/out of the scan/data path, seeding 510*a*, 510*b*, 510*c*, values into the LFSR 102, MISR 104, or mask register 105, or loading 510*d*, 510*e*, 510*f* values into the shift 106 or step 108 counters or step/shift controller 115. Other commands 51 0*h* may be implemented as well.

In the illustrative embodiment, TAP controller 130 implements and is responsive to TAP instructions SELECT_LFSR, SELECT_SCANPATH[x], SELECT_SHIFT_COUNTER, SELECT_STEP_COUNTER, SELECT_SHIFT/STEP, LOAD_LFSR, LOAD_SCANPATH[x], LOAD_SHIFT_COUNTER, LOAD_STEP_COUNTER, LOAD_SHIFT/STEP, and SELECT_SSCTLR. Instruction SELECT_LFSR causes the controller 130 to select the LFSR 102 output as the scan-in signal $S_o$. Instruction SELECT_SCANPATH[x] causes the controller 130 to connect scanpath[x] between the scan-in port 180 and its matching scan-out port 182a–182d, where x indicates one of the scan paths 172a–172d. Instruction SELECT_SCANPATH[x] also causes the controller 130 to select the corresponding scanpath x output 182a–182d as the selected input of multiplexer 138 such that the selected scanpath x output is output on the TDO port 128. Furthermore, instruction SELECT_SCANPATH[x] also enables the corresponding scan shift clock SCAN_CLK[x] to toggle. Instruction SELECT_SHIFT_COUNTER causes the controller 130 to connect shift counter 106 to scan-in port 180. Instruction SELECT_STEP_COUNTER causes the controller 130 to connect step counter 108 to scan-in port 180. Instruction SELECT_SHIFT/STEP causes the controller 130 to connect second shift/step LFSR 152 to scan-in port 180. Instruction SELECT_SSCTLR causes the controller 130 to trigger the shift/step controller 154 to execute.

The test clock (TCK) signal 126 and a test mode select signal (124) are used to control shifting of data into the data path configured by one of the above instructions.

It will be appreciated from the above detailed description that for IC chips which use a full internal scan test methodology, it is possible to add a minimal amount of Built-In-Self-Test (BIST) circuitry to the TAP in order to allow the generation of serial scan test stimulus for the chip and capture serial test responses from the chip. This on-chip hardware eliminates the need for the IC tester to store a substantial percentage of the scan test patterns that consume limited tester resources. In addition, it eliminates the duplication of DFT resources such as an on-chip BIST distribution system and BIST controller. It will be further appreciated that any changes to an IC implemented in accordance with the invention is to the TAP block only—no changes are required in the substantive logic blocks of the IC.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A test apparatus for testing a digital circuit comprising:
a scan data in (SDI) port for serially receiving input scan data;
a first linear feedback shift register which is operable to receive and shift said input scan data to produce a serial stream of pseudorandom scan data in response to only a test clock signal;
a scan-in selector which couples one of said input scan data or said serial stream of pseudorandom scan data to serially load a plurality of scanpaths, each of which produces a respective scan-out signal;
a multiple input signature register coupled to receive said respective scan-out signals and to generate a respective signature corresponding to a function of said respective scan-out signals;
a scan data out (SDO) port; and
an output selector which couples one of said scan-out signals or said signature to said SDO port.

2. A test apparatus in accordance with claim 1, wherein:
said multiple input signature register is maskable to ignore any combination of bits of said incoming scan-out signals when generating said signature.

3. A test apparatus in accordance with claim 1, wherein:
a shift counter which is programmable to shift data through said plurality of scanpaths a programmable number of cycles.

4. A test apparatus in accordance with claim 3, comprising:
a step counter which is programmable to step said digital circuit a programmable number of execution cycles.

5. A test apparatus in accordance with claim 4, wherein:
said multiple input signature register is maskable to ignore any combination of bits of said incoming scan-out signals when generating said signatures.

6. A test apparatus in accordance with claim 5, comprising:
a step/shift controller which is programmable to shift data through said plurality of scanpaths and/or step the digital circuit a programmable sequence of shift and/or execution cycles.

7. A test apparatus in accordance with claim 4, comprising:
a step/shift controller which is programmable to shift data through said plurality of scanpaths and/or step the digital circuit a programmable sequence of shift and/or execution cycles.

8. A test apparatus in accordance with claim 1, comprising:
a step counter which is programmable to step said digital circuit a programmable number of execution cycles.

9. A test apparatus in accordance with claim 1, comprising:
a step/shift controller which is programmable to shift data through said plurality of scanpaths and/or step the digital circuit a programmable sequence of shift and/or execution cycles.

10. A test apparatus in accordance with claim 9, wherein:
said step/shift controller comprises a shift register which shifts a plurality of bits from a first end and to a second end, each bit being in one of a first state or a second state, and each bit output at said second end having said first state causing data to be shifted through said plurality of scanpaths one (or more) shift cycle(s), and each bit output at said second end having and said second state causing said digital circuit to be stepped one (or more) execution cycle(s).

11. A method for allowing testing of an integrated circuit, said integrated circuit comprising a scan data in (SDI) port for serially receiving input scan data, a first linear feedback shift register which is operable to receive and shift said input scan data to produce a serial stream of pseudorandom scan data in response to only a test clock signal, a scan-in selector which couples one of said input scan data or said serial stream of pseudorandom scan data to serially load a plurality of scanpaths, each of which produces a respective scan-out signal, a multiple input signature register coupled to receive said respective scan-out signals and to generate a respective signature corresponding to a function of said respective scan-out signals, a scan data out (SDO) port, and an output selector which couples one of said scan-out signals or said signature to said SDO port, said method comprising:

programming said scan-in selector to couple one or the other of said input scan data and said serial stream of pseudorandom scan data to said plurality of scanpaths; and programming said output selector to couple one of said scan-out signals or said signature to said SDO port.

12. A method in accordance with claim 11, comprising:

shifting in data received at said SDI port.

13. A method in accordance with claim 11, comprising:

shifting out data from said SDO port.

14. A method in accordance with claim 11, said integrated circuit comprising a programmable shift counter, said method comprising:

programming said shift counter to shift a programmable number of shift cycles; and shifting data through said plurality of scanpaths said programmable number of shift cycles.

15. A method in accordance with claim 11, said integrated circuit comprising a programmable step counter, said method comprising:

programming said step counter to step a programmable number of execution cycles; and stepping said integrated circuit said programmable number of execution cycles.

16. A method in accordance with claim 11, comprising:

masking said multiple input signature register to ignore any combination of bits of said scan-out signals when generating said signature.

17. A method in accordance with claim 11, said integrated circuit comprising a step/shift controller which is programmable to shift data through said plurality of scanpaths and/or step said integrated circuit a programmable sequence of shift and/or execution cycles, comprising:

programming said step/shift controller with said programmable sequence of shift and/or execution cycles;

activating said controller to shift data through said plurality of scanpaths and/or step said integrated circuit in accordance with said programmable sequence of shift and/or execution cycles.

* * * * *